United States Patent
Raghunathan et al.

(10) Patent No.: US 10,043,574 B2
(45) Date of Patent: Aug. 7, 2018

(54) PROGRAMMING MEMORIES WITH MULTI-LEVEL PASS SIGNAL

(71) Applicant: MICRON TECHNOLOGY, INC., Boise, ID (US)

(72) Inventors: Shyam Sunder Raghunathan, Sunnyvale, CA (US); Pranav Kalavade, San Jose, CA (US); Krishna K. Parat, Palo Alto, CA (US); Charan Srinivasan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/907,826

(22) Filed: Feb. 28, 2018

(65) Prior Publication Data
US 2018/0190347 A1 Jul. 5, 2018

Related U.S. Application Data

(63) Continuation of application No. 15/189,178, filed on Jun. 22, 2016, now Pat. No. 9,922,704, which is a
(Continued)

(51) Int. Cl.
*G11C 16/04* (2006.01)
*G11C 11/56* (2006.01)
(Continued)

(52) U.S. Cl.
CPC ...... *G11C 11/5628* (2013.01); *G11C 11/5642* (2013.01); *G11C 16/0483* (2013.01); *G11C 16/12* (2013.01); *G11C 16/3427* (2013.01)

(58) Field of Classification Search
CPC ............ G11C 11/5628; G11C 11/5642; G11C 16/0483; G11C 16/12; G11C 16/3427
(Continued)

(56) References Cited

U.S. PATENT DOCUMENTS

| 6,061,270 A | 5/2000 | Choi |
| 6,975,537 B2 | 12/2005 | Lutze et al. |

(Continued)

FOREIGN PATENT DOCUMENTS

| JP | 2000149577 A | 5/2000 |
| JP | 2009193638 A | 8/2009 |
| WO | 2011060078 A1 | 5/2011 |

OTHER PUBLICATIONS

International Search Report for Application No. PCT/US2015/040327 dated Nov. 2, 2015 (4 pages).
(Continued)

*Primary Examiner* — Huan Hoang
(74) *Attorney, Agent, or Firm* — Dicke, Billig & Czaja, PLLC (57) ABSTRACT

Methods of operating a memory include applying a first voltage level to control gates of a plurality of memory cells selected to be programmed while applying a second voltage level to a respective data line for each memory cell of the plurality of memory cells; increasing the voltage level applied to the respective data line for memory cells of a first subset of memory cells to a third voltage level then increasing the voltage level applied to the control gates of the plurality of memory cells to a fourth voltage level; increasing the voltage level applied to the respective data line for each memory cell of a second subset of memory cells of the plurality of memory cells to a fifth voltage level then; and after increasing the voltage level applied to the respective data line for each memory cell of the second subset of memory cells to the fifth voltage level, increasing the voltage level applied to the control gates of the plurality of memory cells to a sixth voltage level.

20 Claims, 7 Drawing Sheets

Related U.S. Application Data continuation of application No. 14/334,946, filed on Jul. 18, 2014, now Pat. No. 9,396,791.

(51) Int. Cl.
  *G11C 16/34* (2006.01)
  *G11C 16/12* (2006.01)

(58) Field of Classification Search
  USPC .................................................. 365/185.03
  See application file for complete search history.

(56) References Cited

U.S. PATENT DOCUMENTS

| | | | |
|---|---|---|---|
| 7,286,408 | B1 | 10/2007 | Higashitani |
| 7,292,476 | B2 | 11/2007 | Goda et al. |
| 7,324,383 | B2 | 1/2008 | Incarnati et al. |
| 7,489,543 | B1 | 2/2009 | Lee |
| 7,499,330 | B2 | 3/2009 | Goda et al. |
| 7,508,711 | B2 | 3/2009 | Goda |
| 7,738,295 | B2 | 1/2010 | Lee |
| 7,692,971 | B2 | 4/2010 | Moschiano et al. |
| 7,679,961 | B2 | 6/2010 | Lee et al. |
| 8,139,414 | B2 | 3/2012 | Kim et al. |
| 8,274,838 | B2 | 9/2012 | Dutta et al. |
| 8,411,508 | B2 | 4/2013 | Kalavade et al. |
| 8,472,256 | B2 | 6/2013 | Ruby et al. |
| 9,396,791 | B2 * | 7/2016 | Raghunathan ...... G11C 11/5628 |
| 9,922,704 | B2 * | 3/2018 | Raghunathan ...... G11C 11/5628 |
| 2009/0207657 | A1 | 8/2009 | Tamada |
| 2011/0194352 | A1 | 8/2011 | Zhao et al. |
| 2012/0163076 | A1 | 6/2012 | Sarin et al. |
| 2012/0243318 | A1 | 9/2012 | Moschiano et al. |
| 2013/0010540 | A1 | 1/2013 | Jones |
| 2013/0343123 | A2 | 12/2013 | Kim |
| 2015/0043275 | A1 | 2/2015 | Srinivasan et al. |
| 2015/0357031 | A1 | 12/2015 | Tang et al. |

OTHER PUBLICATIONS

Japan Office Action for JP Application No. 2017-502102 dated Apr. 3, 2018 (12 Pages).

* cited by examiner

FIG. 7

PROGRAMMING MEMORIES WITH MULTI-LEVEL PASS SIGNAL

RELATED APPLICATIONS

This Application is a continuation of U.S. application Ser. No. 15/189,178, titled "PROGRAMMING MEMORIES WITH MULTI-LEVEL PASS SIGNAL," filed Jun. 22, 2016, (allowed), which is a continuation of U.S. application Ser. No. 14/334,946, titled "PROGRAMMING MEMORIES WITH MULTI-LEVEL PASS SIGNAL," filed Jul. 18, 2014, now U.S. Pat. No. 9,396,791 issued on Jul. 19, 2016, which are commonly assigned and incorporated herein by reference.

TECHNICAL FIELD

The present embodiments relate generally to memory devices and a particular embodiment relates to programming in memory devices.

BACKGROUND

Memory devices (which are sometimes referred to herein as "memories") are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common electronic systems that utilize flash memory devices include, but are not limited to, personal computers, personal digital assistants (PDAs), digital cameras, digital media players, digital recorders, games, appliances, vehicles, wireless devices, cellular telephones, and removable memory modules, and the uses for flash memory continue to expand.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory. In a four level MLC, there are four potential final data states. One technique used to increase the memory capacity of a NAND memory device is to form the memory array in a three dimensional (3D) manner. In other words, instead of the series memory strings being formed horizontally on a memory die which is typically referred to as 2D memory, the series strings are formed vertically on a substrate.

Programming in memories is typically accomplished by applying a plurality of programming pulses at a programming voltage ($V_{pgm}$), separated by verify pulses, to program each memory cell of a selected group (e.g., a selected page) of memory cells to a respective target data state (which may be an interim or final data state). With such a scheme, the programming pulses are applied to access lines (e.g., word lines) for selected cells. After each programming pulse, a verify pulse or a plurality of verify pulses are used to verify the programming of the selected cells. Current programming uses many programming pulses in an incremental step pulse programming scheme, where each programming pulse is a single pulse that moves cell threshold voltage by a certain amount, with $V_{pgm}$ increasing with each subsequent programming pulse.

NAND memories are typically programmed by holding a channel of a selected cell to be programmed at a reference voltage (e.g., ground), or at a selective slow programming convergence (SSPC) voltage, and applying the programming pulses and verify pulses described above. Programming using this method is applicable for any programmed target data state (e.g., L1, L2, L3 in the case of a two bits per cell multi-level memory, where L0 may be an "erased" target data state). The first programming operation typically uses a $V_{pgm}$ high enough to start programming selected cells to a first programmed data state (e.g., L1), but low enough to not overshoot the programming of those cells to the second programmed target data state (e.g., L2). The program voltage increases sequentially in subsequent operations, until the cells to be programmed to the third programmed data state (L3) are finished programming and the program operation is completed.

As NAND density increases with scaling, increased access line and data line (e.g., bit line) capacitances lead to an increased programming time ($T_{prog}$). In addition, new array architectures used in conjunction with three dimensional NAND also result in increased capacitances, further driving up $T_{prog}$. Program disturb effects, which are well known, are typically controlled during programming, so as to have as small an impact on final threshold voltages in programming as can be managed.

For the reasons stated above and for other reasons that will become apparent to those skilled in the art upon reading and understanding the present specification, there is a need in the art for improved programming time in memories.

DETAILED DESCRIPTION

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 1:
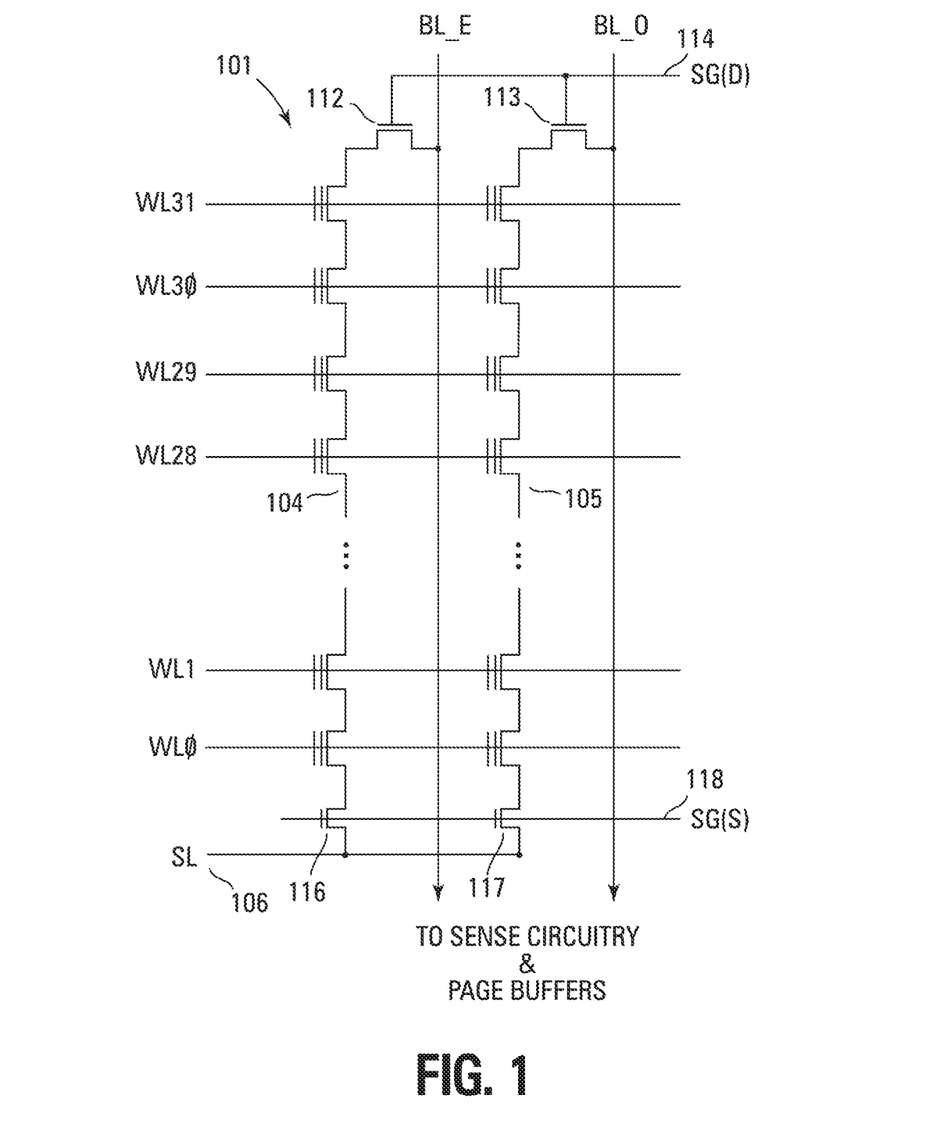
FIG. 1 is a schematic diagram of one embodiment of a portion of a NAND architecture memory array.

FIG. 1 illustrates a schematic diagram of one embodiment of a portion of a NAND architecture memory array 101 comprising series strings of non-volatile memory cells. The memory array 101 comprises an array of non-volatile memory cells (e.g., floating gate) arranged in columns such as series strings 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry that detect and store the state of each cell by sensing current or voltage on a selected bit line.

Each series string 104, 105 of memory cells is coupled to a source 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

Figure 2:
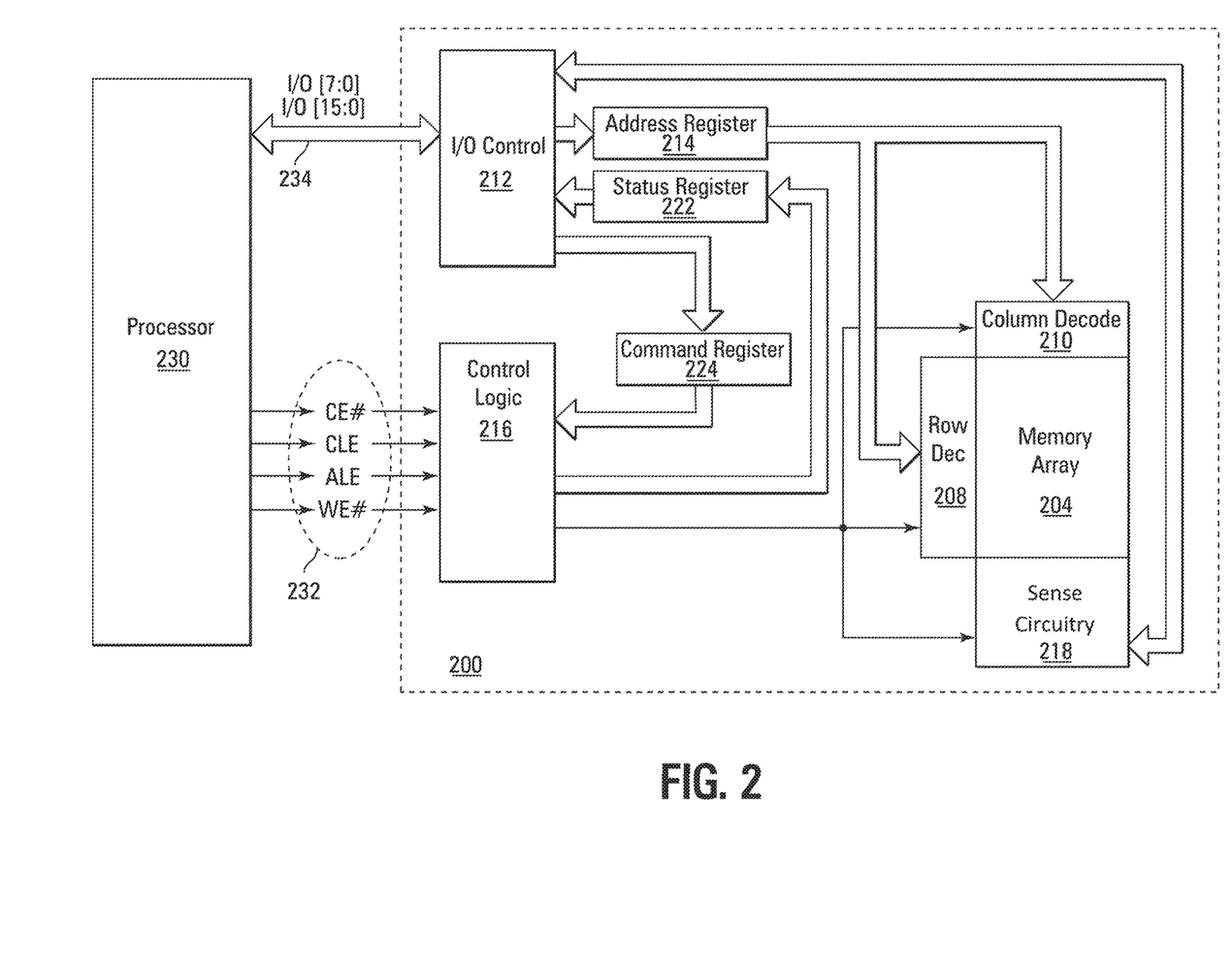
FIG. 2 is a block schematic of an electronic system in accordance with an embodiment of the disclosure.

FIG. 2 is a simplified block diagram of a memory device 200 according to an embodiment of the disclosure, and on which various embodiments of the disclosure can be practiced. Memory device 200 includes an array of memory cells 204 arranged in rows and columns. Although the various embodiments will be described primarily with reference to NAND memory arrays, the various embodiments are not limited to a specific architecture of the memory array 204. Some examples of other array architectures suitable for the present embodiments may include NOR arrays, AND arrays, and virtual ground arrays. Further, the embodiments described herein may be amenable for use with SLC and MLC memories without departing from the scope of the disclosure. Also, the methods are applicable for memories which could be read/sensed in analog format.

Row decode circuitry 208 and column decode circuitry 210 are provided to decode address signals provided to the memory device 200. Address signals are received and decoded to access memory array 204. Memory device 200 also includes input/output (I/O) control circuitry 212 to manage input of commands, addresses and data to the memory device 200 as well as output of data and status information from the memory device 200. An address register 214 is coupled between I/O control circuitry 212 and row decode circuitry 208 and column decode circuitry 210 to latch the address signals prior to decoding. A command register 224 is coupled between I/O control circuitry 212 and control logic 216 (which may include the elements and code of host 230) to latch incoming commands. In one embodiment, control logic 216, I/O control circuitry 212 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. Control logic 216 controls access to the memory array 204 in response to the commands and generates status information for an external host such as a host 230. The control logic 216 is coupled to row decode circuitry 208 and column decode circuitry 210 to control the row decode circuitry 208 and column decode circuitry 210 in response to the received address signals. A status register 222 is coupled between I/O control circuitry 212 and control logic 216 to latch the status information for output to an external controller.

Memory device 200 receives control signals at control logic 216 over a control link 232. The control signals may include a chip enable CE#, a command latch enable CLE, an address latch enable ALE, and a write enable WE#. Memory device 200 may receive commands (in the form of command signals), addresses (in the form of address signals), and data (in the form of data signals) from an external controller over a multiplexed input/output (I/O) bus 234 and output data to an external controller over I/O bus 234. I/O bus 234 is also used in one embodiment to signal physically to the host 230 that housekeeping is indicated.

In a specific example, commands are received over input/output (I/O) pins [7:0] of I/O bus 234 at I/O control circuitry 212 and are written into command register 224. The addresses are received over input/output (I/O) pins [7:0] of bus 234 at I/O control circuitry 212 and are written into address register 214. The data may be received over input/output (I/O) pins [7:0] for a device capable of receiving eight parallel signals, or input/output (I/O) pins [15:0] for a device capable of receiving sixteen parallel signals, at I/O control circuitry 212 and are transferred to sense circuitry (e.g., sense amplifiers and page buffers) 218. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 2 has been simplified to help focus on the embodiments of the disclosure.

Additionally, while the memory device of FIG. 2 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 234. Because the data signals represent bit patterns instead of individual bits, serial communication of an 8-bit data signal could be as efficient as parallel communication of eight signals representing individual bits.

Methods for programming may be performed in various embodiments on a memory such as memory device 200. Such methods are shown and described herein with reference to FIGS. 3-7.

Embodiments of the present disclosure offer improved performance of programming in memories, such as in the number of programming pulses used and in the time it takes to program ($T_{prog}$). Some embodiments use the concept of program disturb to program cells to intermediate target data states in a multi-level memory during the time that selected cells are programmed to a highest target data state using a conventional programming operation. Such embodiments may be referred to as boosted channel programming (BCP), e.g., using a boosted channel voltage to slow, but not inhibit, programming of memory cells to lower (e.g., intermediate) final data states while programming other memory cells to higher (e.g., highest) final data states. For example, in a four level MLC (i.e., 2 bits per cell), the four final data states are level 0 (L0), level 1 (L1), level 2 (L2), and level 3 (L3). L0 is typically considered the lowest (final) target data state as it is typically associated with the lowest threshold voltage range (e.g., −0.5 to −1.5 V). Level 3 is typically considered the highest (final) target data state as it is typically associated with the highest threshold voltage range (e.g., 3.5 to 4.5 V). L1 and L2 are typically considered the intermediate (final) target data states as they are typically associated with threshold voltage ranges that are lower than the range associated with L3, but higher than the range associated with L0 (L2, e.g., 1.5 to 2.5 V, and L1, e.g., 0.2 to 1.0 V).

Figure 3:
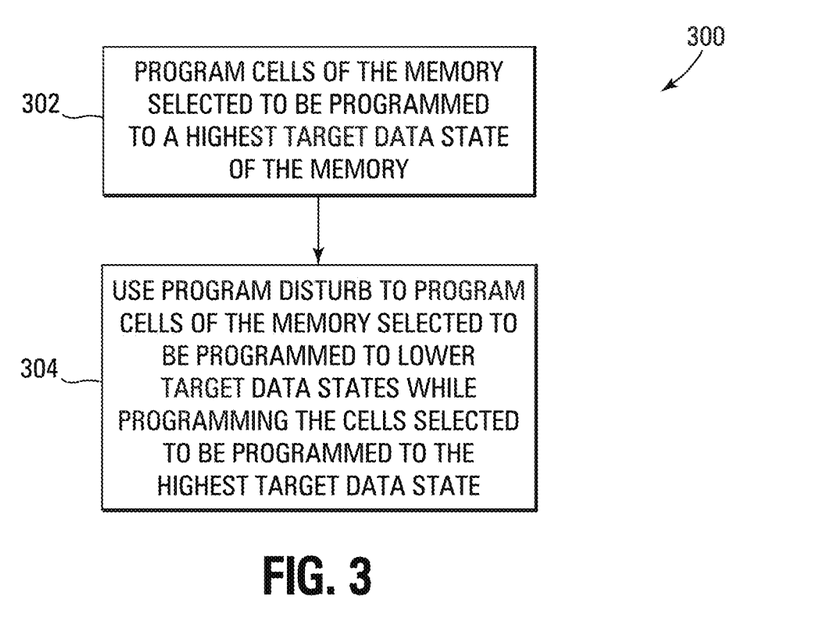
FIG. 3 is a flow chart diagram of a method according to one embodiment of the present disclosure.

FIG. 3 shows a method 300 of programming a memory such as memory 200 shown above. Method 300 comprises, in one embodiment, programming cells of the memory selected to be programmed to a particular (e.g., highest) target data state of the memory in block 302, and using program disturb to program cells of the memory selected to be programmed to lower target data states while programming the cells selected to be programmed to the highest target data state in block 304. In a four level MLC, for cells selected to be programmed, their control gates are biased at $V_{pgm}$, and cells selected to be programmed to L3 are programmed with their channels at a reference voltage (e.g., ground), while cells selected to be programmed to L2 and L1 are programmed with their channels boosted to an appropriate potential that slows down their programming. This enables starting programming pulses at a $V_{pgm}$ appropriate for L3 programming instead of L1 programming.

The cells to be programmed to the highest target data state are programmed in one embodiment with their channels at a reference voltage (e.g., ground). The cells to be programmed to the lower target data states are programmed in one embodiment with boosted channel voltages. The channels are boosted to slow programming of the cells to be programmed to the lower target data states.

In one embodiment, boosted channel voltages are applied using a multi-level pass signal ($V_{pass}$). In a four level MLC, there could be, for example, three boosted channel voltages/a three-level pass voltage. In an eight level (three bits per cell) MLC, there could be, for example, seven boosted channel voltages/a seven-level pass voltage. Applying a multi-level pass signal comprises, in at least one embodiment, applying a stepped pass signal (e.g., a pass signal increasing in constant or variable voltage steps), applying a graduated pass signal (e.g., a pass signal increasing at an increasing or decreasing rate), or applying a ramped pass signal (e.g., a pass signal increasing at a constant rate).

Using program disturb to program cells of the memory selected to be programmed to lower target data states as in block 304 comprises in one embodiment boosting a channel voltage for cells of the memory selected to be programmed to lower target data states. In at least one embodiment, boosting comprises applying a multi-step pass voltage to access lines of the memory prior to programming cells of the memory that are selected to be programmed to the highest target data state.

At a first step of the multi-step pass voltage, data lines coupled to cells selected to be programmed to the lowest target data state are raised to an inhibit voltage, such as Vcc (e.g., to inhibit programming), before application of the first step of the multi-step pass voltage. At each subsequent step of the multi-step pass voltage, data lines coupled to cells selected to be programmed to a respective next highest target data state are raised to the inhibit voltage before application of the respective next step of the stepped pass voltage, until all data lines except data lines coupled to cells selected to be programmed to a highest target data state have been raised to the inhibit voltage. A program pulse is then applied to the cells selected to be programmed (e.g., cells coupled to a selected access line). Although the multi-step pass voltage is applied to cells (in a block being programmed) that are not selected to be programmed (e.g., it may be applied to all unselected access lines of the block being programmed), the program pulse is only applied to the cells then selected to be programmed (e.g., the cells coupled to the selected access line of the block).

In one embodiment, SSPC programming is implemented with the multi-step pass voltage. In traditional programming, SSPC is implemented by applying a voltage through the data line, for example, applying an SSPC potential on a data line through the drain select gate SGD. Implementation with the multi-step pass voltage enables a smaller SGD voltage on boosted channel programming, which may further improve program disturb impacted by SGD leakage. Implementing SSPC programming further comprises, in one embodiment, applying one of a plurality of different SSPC voltages to data lines coupled to cells selected to be programmed based on how close the respective cell is to its target data state. For example, if a cell is close to its target data state, a higher SSPC voltage may be applied to the corresponding data line in conjunction with the corresponding step of the multi-step Vpass; meanwhile, if the cell is not close to its target data state, a lower SSPC voltage may be applied to the corresponding data line in conjunction with the respective step of the multi-step Vpass.

Figure 4:
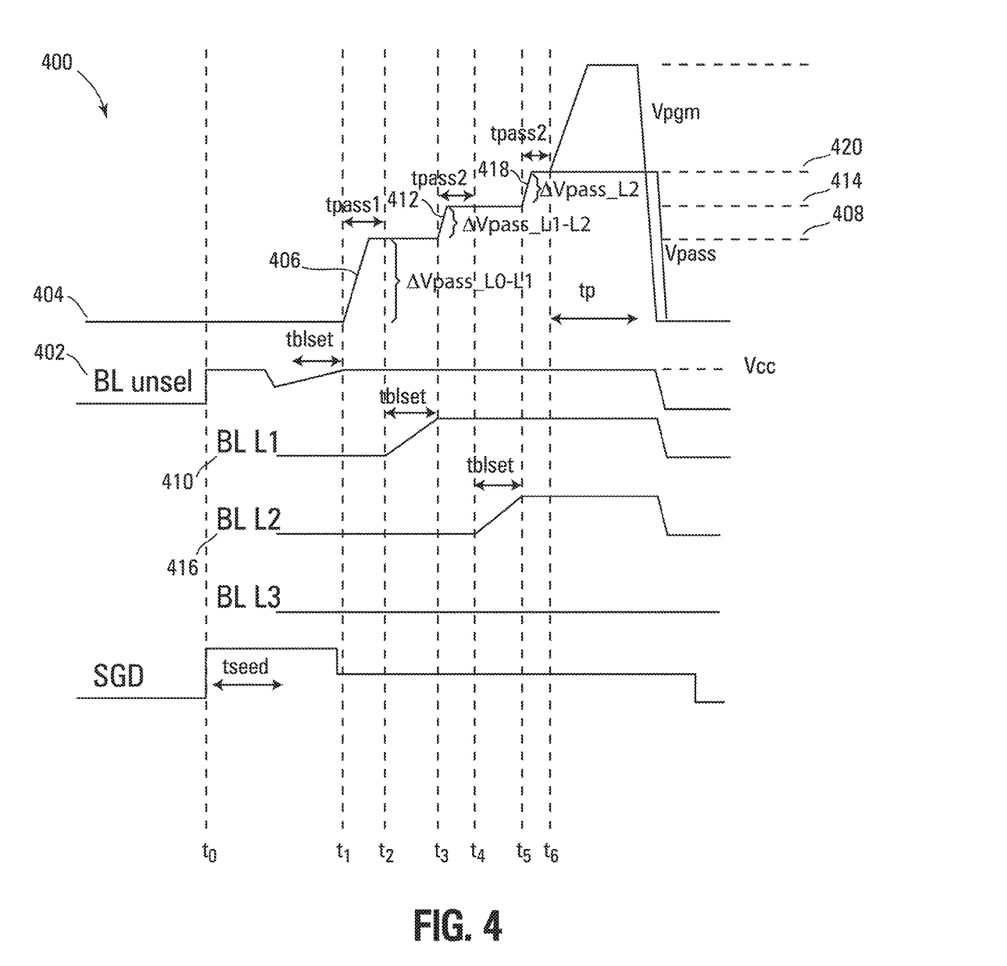
FIG. 4 is a waveform diagram for operation of the method of FIG. 3.

A timing diagram 400 for operation of the method of FIG. 3 for a four level (two bits per cell) memory device embodiment is shown in FIG. 4. At time $t_0$, unselected bit lines (402) (e.g., bit lines that are coupled to cells of a selected word line that are to remain at L0) are raised to an inhibit voltage (e.g., $V_{cc}$ or an SSPC voltage). A pass voltage $V_{pass}$ (404), applied to both unselected access lines and the selected access line, is raised at time $t_1$ in a first step 406 to a level 408, boosting the channel potential of the cells that are to remain at L0. At time t2, bit lines coupled to cells of a selected word line to be programmed to L1 (410) are raised to an inhibit voltage. The pass voltage is raised at time t3 in a second step 412 to a level 414, boosting the channel potential of the cells that are to remain at L1 and further boosting the channel potential of the cells that are to remain at L0. At time t4, bit lines coupled to cells of a selected word line to be programmed to L2 (416) are raised to an inhibit voltage. The pass voltage is raised at time $t_5$ in a third step 418 to a level 420, boosting the channel potential of the cells that are to remain at L2 and further boosting the channel potential of the cells that are to remain at L0 and L1. Once the channels of all of the cells selected to be programmed to one of levels L0, L1, and L2 are boosted, at time $t_6$ a program voltage $V_{pgm}$ is applied to the cells coupled to the selected word line to program all of the selected cells, at the same time, towards their respective target data states.

The levels 408, 414, and 420 to which $V_{pass}$ is raised are chosen to raise the voltages of the channels of cells to be programmed to L0, L1, and L2 to voltages appropriate to allow their programming using program disturb at the same time cells to be programmed to L3 are normally programmed. In one embodiment, a target threshold voltage for L3 cells is identified as PV3, a target threshold voltage for L2 cells is identified as PV2, and a target threshold voltage for L1 cells is identified as PV1. L2 cell channels can be boosted to PV3-PV2, and L1 cell channels can be boosted to PV3-PV1. For example, if PV3=4 volts, PV2=2 volts, and PV1=0.5 volts, then the channels of L2 cells can be boosted to PV3-PV2=2 volts, and the channels of L1 cells can be boosted to PV3−PV1=3.5 volts. L0 cell channels can be boosted for inhibit, to approximately 7-8 volts. After application of the programming pulse, for example in situations where more than a threshold number of cells are not program verified after the pulse, the waveform may be repeated with cells that passed program verify in the pulse getting biased the same as unselected bit lines in subsequent pulses.

Figure 5:
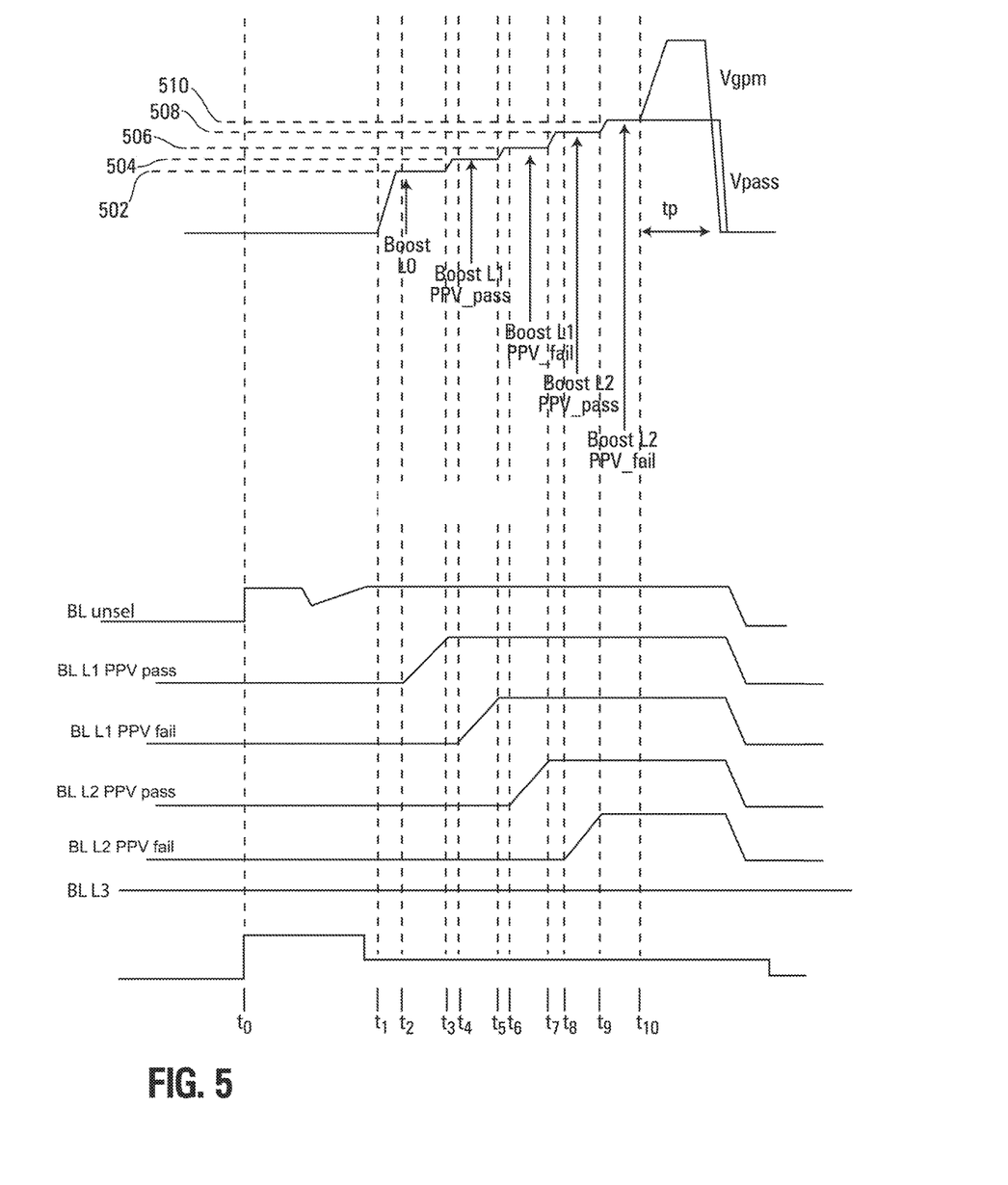
FIG. 5 is a waveform diagram for operation of another method of the present disclosure.

FIG. 5 illustrates an embodiment where SSPC is implemented with a multi-level $V_{pass}$. At time $t_0$, unselected bit lines (e.g., bit lines that are coupled to cells of a selected word line that are to remain at L0) are raised to an inhibit voltage (e.g., $V_{cc}$ or an SSPC voltage), and a seed pulse is applied to the drain select gate (SGD). At time $t_1$, $V_{pass}$ is raised to a first level 502 and applied to both unselected word lines and the selected word line, boosting the channel potential of cells that are to remain at L0. At time t2, bit lines coupled to cells of a selected word line to be programmed to L1 that are near their final target data states, e.g., those cells coupled to a selected word line that have reached an interim target data state (PPV1) near their final target data state (as well as further boosting the channels of the L0 cells) are raised to an inhibit voltage. At time t3, $V_{pass}$ is raised to a second level 504 for boosting the channel potential of cells to be programmed to L1 that are near their final target data state. At time t4, bit lines coupled to cells of a selected word line to be programmed to L1 that have not yet reached their interim target data state are raised to an inhibit voltage. At time $t_5$, $V_{pass}$ is raised to a third level 506 for boosting the channel potential of cells to be programmed to L1 that have not yet reached their interim target data state (as well as further boosting the channels of the L0 cells and the channels of the L1 cells that have reached their interim target data state). At time $t_6$, bit lines coupled to cells of a selected word line to be programmed to L2 that are near their final target data states, e.g., those cells coupled to a selected word line that have reached an interim target data state (PPV2) near their final target data state (as well as further boosting the channels of the L0 and L1 cells) are raised to an inhibit voltage. At time t7, $V_{pass}$ is raised to a fourth level 508 for boosting the channel potential of cells to be programmed to L2 that are near their final target data states, e.g., those cells coupled to the selected word line that have reached an interim target data state (PPV2) near their final target data state (as well as further boosting the channels of the L0 and L1 cells). At time $t_8$, bit lines coupled to cells of a selected word line to be programmed to L2 that have not yet reached their interim target data state are raised to an inhibit voltage. At time t9, $V_{pass}$ is raised to a fifth level 510 for boosting the channels of cells to be programmed to L2 that have not yet reached their interim target data state. At time $t_{10}$, a program voltage $V_{pgm}$ is applied to the cells coupled to the selected word line to program all of the selected cells, at the same time, towards their respective target data states.

Figure 6:
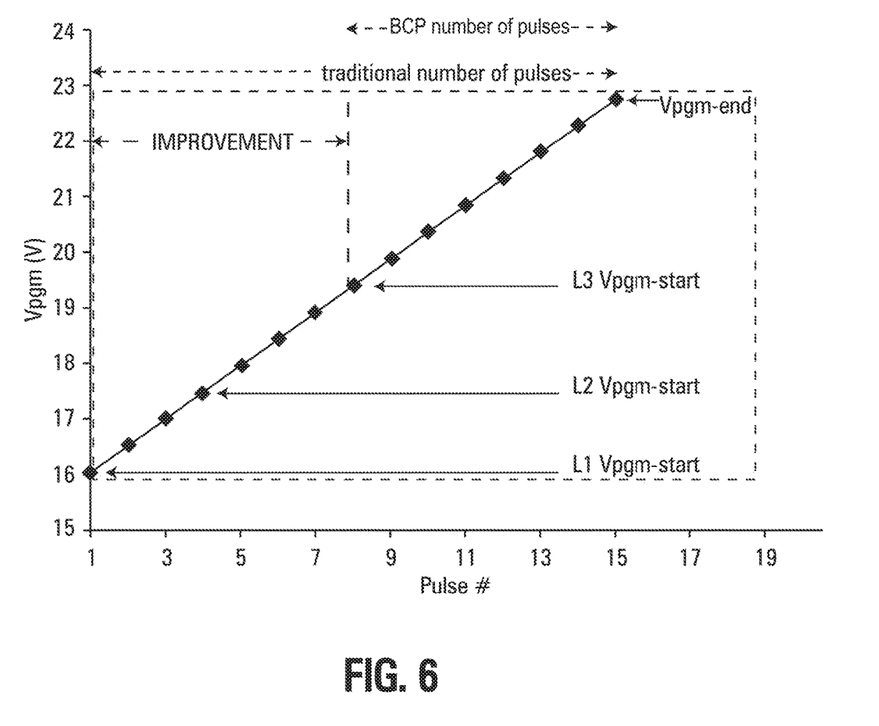
FIG. 6 is a diagram showing programming pulses versus level programming for embodiments of the present disclosure.

FIG. 6 shows graphically a difference between programming traditionally and programming using embodiments of the present disclosure for a four level (two bits per cell) memory. In a traditional programming method, programming pulses start at a $V_{pgm}$ level of approximately 16 volts, incrementing with each successive programming pulse to approximately 23 volts. Programming begins at pulse 1, where some of the cells selected for programming might start to reach their target data state L1, and by about the fourth pulse, for example, some of the cells selected for programming might start to reach their target data state of L2. At about pulse 8, at a $V_{pgm}$ of approximately 19 volts, some of the selected cells might start reaching their target data state of L3, where all of the cells capable of being programmed to their target data state have likely reached their respective target data state by about the 15th pulse (having a Vpgm of approximately 23V). In the embodiments of the present disclosure, because of the boosted channel voltages from the multi-step $V_{pass}$ voltage, programming of all cells can begin at the $V_{pgm}$ level traditionally used to start L3 programming, in this example at approximately 19 volts. Programming of all cells at levels L1, L2, and L3 might then be accomplished in about 8 programming pulses, thus reducing the number of programming pulses used for programming from 14 to 8. While example programming voltages have been discussed, it should be understood that other programming voltages may be used, and that the voltages depend on the particular programming and device, without departing from the scope of the disclosure.

In a programming operation, the waveform of FIG. 5 is applied after at least one program pulse has been completed. The first pulse does not use SSPC. The verify (PPV/PV) information at the end of the first pulse is used to identify SSPC cells from the second pulse onwards.

While programming a memory with four level MLCs having four final target data states (L0, L1, L2, and L3) has been shown, it should be understood that the programming methods disclosed herein are suitable for programming multi-level cells having a fewer or a greater number of interim and/or final data states without departing from the scope of the disclosure.

Figure 7:
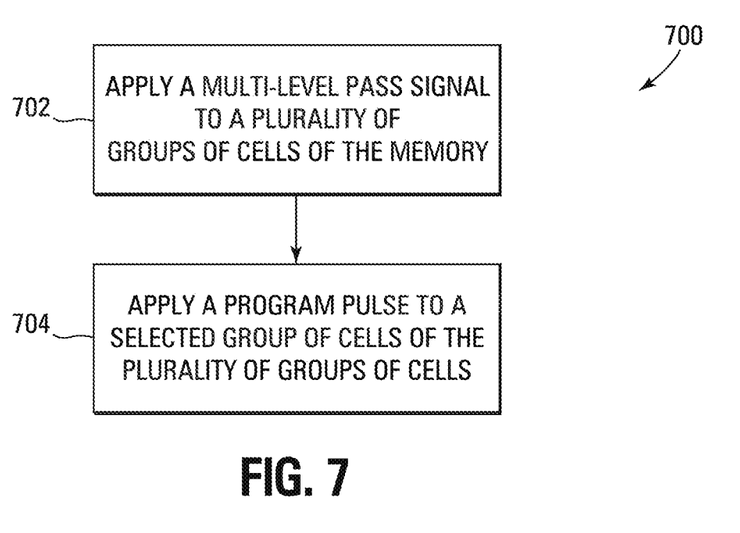
FIG. 7 is a flow chart diagram of a method according to another embodiment of the present disclosure.

Another method 700 for programming a memory is shown in flow chart form in FIG. 7. Method 700 comprises in one embodiment applying a multi-level pass signal to a plurality of groups of cells of the memory in block 702, and subsequently applying a program pulse to a selected group of cells of the plurality of groups of cells in block 704. Applying the multi-level pass signal in one embodiment boosts channel voltages for a first subset of the selected group of cells such that the subsequent application of the program pulse causes the first subset of the selected group of cells to be programmed towards one of a plurality of target data states other than a particular target data state to which a second subset of the selected group of cells are being programmed towards. The multi-level pass signal may be a voltage signal or a current signal, and the program pulse may be a voltage pulse or a current pulse.

CONCLUSION

In summary, one or more embodiments of the disclosure show boosted channel programming for memories, in which channels of cells to be programmed to lower target data states are boosted using a multi-level pass signal, and a programming pulse traditionally used for programming cells towards a higher target data state is applied to all of the selected cells to program the selected cells towards their respective target data states at the same time.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory, comprising:
applying a first voltage level to control gates of a plurality of memory cells selected to be programmed during a programming operation while applying a second voltage level to a respective data line for each memory cell of the plurality of memory cells;
increasing the voltage level applied to the respective data line for each memory cell of a first subset of memory cells of the plurality of memory cells to a third voltage level while applying the first voltage level to the control gates of the plurality of memory cells;

after increasing the voltage level applied to the respective data line for each memory cell of the first subset of memory cells to the third voltage level, increasing the voltage level applied to the control gates of the plurality of memory cells to a fourth voltage level;

increasing the voltage level applied to the respective data line for each memory cell of a second subset of memory cells of the plurality of memory cells to a fifth voltage level while applying the fourth voltage level to the control gates of the plurality of memory cells, wherein the second subset of memory cells is mutually exclusive of the first subset of memory cells; and after increasing the voltage level applied to the respective data line for each memory cell of the second subset of memory cells to the fifth voltage level, increasing the voltage level applied to the control gates of the plurality of memory cells to a sixth voltage level.

2. The method of claim 1, further comprising:
after increasing the voltage level applied to the control gates of the plurality of memory cells to the sixth voltage level, increasing the voltage level applied to the control gates of the plurality of memory cells to a programming voltage.

3. The method of claim 2, further comprising:
applying the programming voltage to the control gates of the plurality of memory cells while applying the third voltage level to the respective data line for each memory cell of the first subset of memory cells, while applying the fifth voltage level to the respective data line for each memory cell of the second subset of memory cells.

4. The method of claim 3, further comprising:
applying the programming voltage to the control gates of the plurality of memory cells while applying the second voltage level to the respective data line for each memory cell of a third subset of memory cells of the plurality of memory cells;
wherein the third subset of memory cells is mutually exclusive of the first subset of memory cells and mutually exclusive of the second subset of memory cells.

5. The method of claim 4, wherein a union of the first subset of memory cells, the second subset of memory cells and the third subset of memory cells is the plurality of memory cells.

6. The method of claim 4, wherein each memory cell of the first subset of memory cells has a first desired data state for the programming operation, wherein each memory cell of the second subset of memory cells has a second desired data state for the programming operation, wherein each memory cell of the third subset of memory cells has a third desired data state for the programming operation, wherein a threshold voltage range corresponding to the second desired data state is higher than a threshold voltage range corresponding to the first desired data state, and wherein a threshold voltage range corresponding to the third desired data state is higher than the threshold voltage range corresponding to the second desired data state.

7. The method of claim 1, wherein the plurality of memory cells is a first plurality of memory cells, the method further comprising:
while applying the first voltage level to the control gates of the first plurality of memory cells, applying a seventh voltage level to a respective data line for each memory cell of a second plurality of memory cells not selected to be programmed during the programming operation and applying the first voltage level to control gates of the second plurality of memory cells;
wherein the control gates of the first plurality of memory cells and the control gates of the second plurality of memory cells are each connected to a same access line to receive the first voltage level;
wherein the third voltage level, the fifth voltage level and the seventh voltage level are each a same voltage level; and
wherein the seventh voltage level is configured to inhibit each memory cell of the second plurality of memory cells from programming.

8. The method of claim 1, further comprising:
increasing the voltage level applied to the respective data line for each memory cell of a third subset of memory cells of the plurality of memory cells to a seventh voltage level while applying the sixth voltage level to the control gates of the plurality of memory cells;
after increasing the voltage level applied to the respective data line for each memory cell of the third subset of memory cells to the seventh voltage level, increasing the voltage level applied to the control gates of the plurality of memory cells to an eighth voltage level;
increasing the voltage level applied to the respective data line for each memory cell of a fourth subset of memory cells of the plurality of memory cells to a ninth voltage level while applying the eighth voltage level to the control gates of the plurality of memory cells; and
after increasing the voltage level applied to the respective data line for each memory cell of the fourth subset of memory cells to the ninth voltage level, increasing the voltage level applied to the control gates of the plurality of memory cells to a tenth voltage level;
wherein the first subset of memory cells, the second subset of memory cells, the third subset of memory cells, and the fourth subset of memory cells are each mutually exclusive of one another.

9. The method of claim 8, further comprising:
after increasing the voltage level applied to the control gates of the plurality of memory cells to the tenth voltage level, increasing the voltage level applied to the control gates of the plurality of memory cells to a programming voltage while applying the third voltage level to the respective data line for each memory cell of the first subset of memory cells, while applying the fifth voltage level to the respective data line for each memory cell of the second subset of memory cells, while applying the seventh voltage level to the respective data line for each memory cell of the third subset of memory cells, while applying the ninth voltage level to the respective data line for each memory cell of the fourth subset of memory cells, and while applying the second voltage level to the respective data line for each memory cell of a fifth subset of memory cells of the plurality of memory cells;
wherein the first subset of memory cells, the second subset of memory cells, the third subset of memory cells, the fourth subset of memory cells, and the fifth subset of memory cells are each mutually exclusive of one another.

10. The method of claim 9, wherein each memory cell of the first subset of memory cells has a first desired data state for the programming operation, wherein each memory cell of the second subset of memory cells has the first desired data state for the programming operation, wherein each memory cell of the third subset of memory cells has a second desired data state for the programming operation, wherein each memory cell of the fourth subset of memory cells has the second desired data state for the programming operation, wherein each memory cell of the fifth subset of memory cells has a third desired data state for the programming operation, wherein a threshold voltage range corresponding to the second desired data state is higher than a threshold voltage range corresponding to the first desired data state, and wherein a threshold voltage range corresponding to the third desired data state is higher than the threshold voltage range corresponding to the second desired data state.

11. A method of operating a memory, comprising:
applying a first voltage level to an access line connected to control gates of a first plurality of memory cells selected to be programmed during a programming operation and connected to control gates of a second plurality of memory cells not selected to be programmed during the programming operation;
while applying the first voltage level to the access line, applying a second voltage level to a respective data line for each memory cell of the first plurality of memory cells and for each memory cell of the second plurality of memory cells;
after applying the second voltage level to the respective data line for each memory cell of the first plurality of memory cells and for each memory cell of the second plurality of memory cells, increasing the voltage level applied to the respective data line for each memory cell of the second plurality of memory cells to a third voltage level while applying the first voltage level to the access line;
after increasing the voltage level applied to the respective data line for each memory cell of the second plurality of memory cells to the third voltage level, increasing the voltage level applied to the access line to a fourth voltage level;
increasing the voltage level applied to the respective data line for each memory cell of a first subset of memory cells of the first plurality of memory cells to a fifth voltage level while applying the fourth voltage level to the access line;
after increasing the voltage level applied to the respective data line for each memory cell of the first subset of memory cells to the fifth voltage level, increasing the voltage level applied to the access line to a sixth voltage level;
increasing the voltage level applied to the respective data line for each memory cell of a second subset of memory cells of the first plurality of memory cells to a seventh voltage level while applying the sixth voltage level to the access line;
after increasing the voltage level applied to the respective data line for each memory cell of the second subset of memory cells to the seventh voltage level, increasing the voltage level applied to the access line to an eighth voltage level; and
after increasing the voltage level applied to the access line to the eighth voltage level, increasing the voltage level applied to the access line to a programming voltage;
wherein the first subset of memory cells is mutually exclusive of the second subset of memory cells.

12. The method of claim 11, further comprising:
applying the programming voltage applied to the access line while applying the third voltage level to the respective data line for each memory cell of the second plurality of memory cells, while applying the fifth voltage level to the respective data line for each memory cell of the first subset of memory cells, while applying the seventh voltage level to the respective data line for each memory cell of the second subset of memory cells, and while applying the second voltage level to the respective data line for each memory cell of a third subset of memory cells of the first plurality of memory cells;
wherein the third subset of memory cells is mutually exclusive of the first subset of memory cells and mutually exclusive of the second subset of memory cells.

13. The method of claim 12, wherein the first plurality of memory cells consists of a union of the first subset of memory cells, the second subset of memory cells and the third subset of memory cells.

14. The method of claim 12, wherein each memory cell of the second plurality of memory cells has a desired data state corresponding to a first range of threshold voltages for the programming operation, wherein each memory cell of the first subset of memory cells has a desired data state corresponding to a second range of threshold voltages for the programming operation, wherein each memory cell of the second subset of memory cells has a desired data state corresponding to a third range of threshold voltages for the programming operation, wherein each memory cell of the third subset of memory cells has a desired data state corresponding to a fourth range of threshold voltages for the programming operation, wherein the second threshold voltage range is higher than the first threshold voltage range, wherein the third threshold voltage range is higher than the second threshold voltage range, and wherein the fourth threshold voltage range is higher than the third threshold voltage range.

15. A method of operating a memory, comprising:
applying a first voltage level to an access line connected to control gates of a first plurality of memory cells selected to be programmed during a programming operation and connected to control gates of a second plurality of memory cells not selected to be programmed during the programming operation;
while applying the first voltage level to the access line, applying a second voltage level to a respective data line for each memory cell of the first plurality of memory cells and for each memory cell of the second plurality of memory cells;
after applying the second voltage level to the respective data line for each memory cell of the first plurality of memory cells and for each memory cell of the second plurality of memory cells, increasing the voltage level applied to the respective data line for each memory cell of the second plurality of memory cells to a third voltage level while applying the first voltage level to the access line;
after increasing the voltage level applied to the respective data line for each memory cell of the second plurality of memory cells to the third voltage level, increasing the voltage level applied to the access line to a fourth voltage level;
increasing the voltage level applied to the respective data line for each memory cell of a first subset of memory cells of the first plurality of memory cells to a fifth voltage level while applying the fourth voltage level to the access line;
after increasing the voltage level applied to the respective data line for each memory cell of the first subset of memory cells to the fifth voltage level, increasing the voltage level applied to the access line to a sixth voltage level;

increasing the voltage level applied to the respective data line for each memory cell of a second subset of memory cells of the first plurality of memory cells to a seventh voltage level while applying the sixth voltage level to the access line;

after increasing the voltage level applied to the respective data line for each memory cell of the second subset of memory cells to the seventh voltage level, increasing the voltage level applied to the access line to an eighth voltage level;

increasing the voltage level applied to the respective data line for each memory cell of a third subset of memory cells of the first plurality of memory cells to a ninth voltage level while applying the eighth voltage level to the access line;

after increasing the voltage level applied to the respective data line for each memory cell of the third subset of memory cells to the ninth voltage level, increasing the voltage level applied to the access line to a tenth voltage level;

increasing the voltage level applied to the respective data line for each memory cell of a fourth subset of memory cells of the first plurality of memory cells to an eleventh voltage level while applying the tenth voltage level to the access line;

after increasing the voltage level applied to the respective data line for each memory cell of the fourth subset of memory cells to the eleventh voltage level, increasing the voltage level applied to the access line to a twelfth voltage level;

after increasing the voltage level applied to the access line to the twelfth voltage level, increasing the voltage level applied to the access line to a programming voltage;

wherein the first subset of memory cells, the second subset of memory cells, the third subset of memory cells and the fourth subset of memory cells are each mutually exclusive of one another.

16. The method of claim 15, further comprising:

wherein the third voltage level, the fifth voltage level, the seventh voltage level, the ninth voltage level, and the eleventh voltage level are each a same voltage level; and wherein the third voltage level is configured to inhibit each memory cell of the second plurality of memory cells from programming.

17. The method of claim 15, further comprising:

applying the programming voltage to the access line while applying the third voltage level to the respective data line for each memory cell of the second plurality of memory cells, while applying the fifth voltage level to the respective data line for each memory cell of the first subset of memory cells, while applying the seventh voltage level to the respective data line for each memory cell of the second subset of memory cells, while applying the ninth voltage level to the respective data line for each memory cell of the third subset of memory cells, while applying the eleventh voltage level to the respective data line for each memory cell of the fourth subset of memory cells, and while applying the second voltage level to the respective data line for each memory cell of a fifth subset of memory cells of the first plurality of memory cells;

wherein the first subset of memory cells, the second subset of memory cells, the third subset of memory cells, the fourth subset of memory cells, and the fifth subset of memory cells are each mutually exclusive of one another.

18. The method of claim 17, wherein each memory cell of the second plurality of memory cells has a desired data state corresponding to a first range of threshold voltages for the programming operation, wherein each memory cell of the first subset of memory cells has a desired data state corresponding to a second range of threshold voltages for the programming operation, wherein each memory cell of the second subset of memory cells has a desired data state corresponding to the second range of threshold voltages for the programming operation, wherein each memory cell of the third subset of memory cells has a desired data state corresponding to a third range of threshold voltages for the programming operation, wherein each memory cell of the fourth subset of memory cells has a desired data state corresponding to the third range of threshold voltages for the programming operation, wherein each memory cell of the fifth subset of memory cells has a desired data state corresponding to a fourth range of threshold voltages for the programming operation, wherein the second threshold voltage range is higher than the first threshold voltage range, wherein the third threshold voltage range is higher than the second threshold voltage range, and wherein the fourth threshold voltage range is higher than the third threshold voltage range.

19. The method of claim 15, wherein memory cells of the first subset of memory cells have a particular desired data state for the programming operation and have reached a first interim target data state, and wherein memory cells of the second subset of memory cells have the particular desired data state for the programming operation and have not reached the first interim target data state.

20. The method of claim 19, wherein memory cells of the third subset of memory cells have a different desired data state for the programming operation and have reached a second interim target data state, and wherein memory cells of the fourth subset of memory cells have the different desired data state for the programming operation and have not reached the second interim target data state.

* * * * *